United States Patent

Sandhu et al.

[11] Patent Number: 5,863,603
[45] Date of Patent: Jan. 26, 1999

[54] LIQUID VAPOR DEPOSITION OR ETCHING METHOD

[75] Inventors: Gurtej S. Sandhu; Trung T. Doan, both of Boise, Id.

[73] Assignee: Micron Technology, Inc., Boise, Id.

[21] Appl. No.: 878,729

[22] Filed: Jun. 19, 1997

Related U.S. Application Data

[60] Division of Ser. No. 367,393, Dec. 29, 1994, abandoned, which is a continuation-in-part of Ser. No. 46,684, Apr. 14, 1993.

[51] Int. Cl.$^6$ .................................................. B05D 3/12
[52] U.S. Cl. .................. 427/240; 427/304; 427/305; 427/306; 427/337; 427/377; 427/345
[58] Field of Search .................. 427/240, 337, 427/345, 304–306, 377

[56] References Cited

U.S. PATENT DOCUMENTS

| | | | |
|---|---|---|---|
| 2,956,900 | 10/1960 | Carlson | 427/426 |
| 3,672,939 | 6/1972 | Miller | 427/426 |
| 3,983,266 | 9/1976 | Bahls | 427/426 |
| 4,228,201 | 10/1980 | Feldsfein | 427/437 |
| 4,894,260 | 1/1990 | Kumasaka | 427/241 |
| 5,183,795 | 2/1993 | Ting | 427/437 |

FOREIGN PATENT DOCUMENTS

| | | | |
|---|---|---|---|
| 1012877 | 1/1986 | Japan | 427/294 |
| 1-55386 | 3/1989 | Japan | |

OTHER PUBLICATIONS

F.A. Lowenheim "Modern Electroplating" John Wiley & Sons, 1974 p. 734 (no mo.).

"On the Textue of Electroless Copper Films"–J. Electrochem. S, Solid–State Science and Technology, vol. 135, No. 9, Sep. 1988, pp. 2304–2308.

"Selective Electroless Metal Deposition for Integrated Circuit Fabrication"–J. Electrochem. Soc., vol. 136, Feb. 1989, pp. 456–461.

*Primary Examiner*—Janyce Bell

[57] ABSTRACT

The present invention teaches electroless liquid vapor deposition/etching process for depositing on a reactive or non-reactive substrate surface or etching a film on a substrate surface in a bathless deposition apparatus during ULSI processing by the steps of: applying liquid chemical precursor solutions to the surface of the substrate, the liquid chemical precursor solutions are reactive to one another and enter the chamber of the inert atmosphere deposition apparatus separately; spinning the substrate during the application of the liquid chemical precursor solutions; and depositing or etching the film. The process may be implemented in inert atmosphere by enclosing the whole arrangement in a chamber and flowing inert gases such as Ar, He, and $N_2$, etc.

25 Claims, 2 Drawing Sheets

LIQUID VAPOR DEPOSITION OR ETCHING METHOD

CROSS-REFERENCE TO RELATED APPLICATION

This is a divisional to U.S. patent application Ser. No. 08/367,393, filed Dec. 29, 1994, which is now abandoned is a continuation-in-part to U.S. patent application Ser. No. 08/046,684 filed Apr. 14, 1993.

FIELD OF THE INVENTION

This invention relates to semiconductor technology, and more specifically, to a bathless, electroless process for depositing clean uniform films on a silicon substrate and a process for etching films.

BACKGROUND OF THE INVENTION

Electroless deposition of various metal films (including Ni, Al, Cu, Au and Pd) from liquid chemical precursors consisting of metal ions and reducing agents has been demonstrated. For example, it has been shown that selective electroless deposition of copper on surfaces of metals such as Al, Wsix, etc. is accomplished when the substrates are immersed in liquid baths containing solutions of copper EDTA+formaldehyde, etc. Insulating surfaces such as $SiO_2$, $Si_3N_4$, and BPSG do not get coated with copper.

As a second example, when using this technique to deposit Ni onto Al, three critical aspects must be considered. First, the Al surface must be free of oxide, which can be accomplished by performing a dilute HF dip. Second, the Al surface must be activated since Al is not catalytic for Ni deposition, which can be done by first depositing Pd. Third, the solution to deposit the Ni containing the concentrations of Ni ions and reducing agents will determine the deposition rate. Deposition is followed by an anneal step to remove traces of the solution while improving the adhesion of Ni to the Al.

These examples have common problems in that by using a conventional liquid bath arrangement, the supply of liquid chemicals is not very well controlled and the process does not meet the across the wafer uniformity and cleanliness standards required for advanced ULSI metallization. Also, low life time chemical solutions/mixtures cannot be used in a bath as, unfortunately, chemical degradation will occur.

The following two articles discuss electroless deposition and are herein incorporated by reference. One article entitled "SELECTIVE ELECTROLESS METAL DEPOSITION FOR INTEGRATED CIRCUIT FABRICATION" by Ting et al., J. Electrochem. Soc., Vol. 136, No. 2, February 1989, pp. 456–461, discusses selective electroless metal deposition process compared to selective metal deposition by chemical vapor deposition (CVD). Another article entitled "ON THE TEXTURE OF ELECTROLESS COPPER FILMS" by Junginger et al., Solid State Science And Technology, Vol. 135, No. 9, September 1988, pp. 2304–2308, discusses the textures of electroless copper films as a function of bath parameters and of the plating base.

The present invention allows for the use of chemically incompatible liquids (thus unsuitable for deposition using a liquid bath as they will react with one another once they come in contact to another) to deposit quality films on a substrate surface. The present invention also allows the use of chemically incompatible liquids for the etching of films.

SUMMARY OF THE INVENTION

A embodiment of the present invention describes a method to deposit films from reactive liquid solutions in a bathless electroless deposition system, with uniformity and cleanliness conducive for Ultra-Large Scale Integration (USLI) processing. Another embodiment of the present invention describes a method to etch films using chemically reactive liquid solutions in a bathless electroless system.

The present invention teaches electroless liquid vapor deposition/etching process for depositing or etching a film on a non-reactive substrate surface in a bathless deposition apparatus during ULSI processing by the steps of: applying liquid chemical precursor solutions to the surface of the substrate, the liquid chemical precursor solutions are reactive to one another and enter the chamber of the inert atmosphere deposition apparatus separately; spinning the substrate during the application of the liquid chemical precursor solutions; and depositing or etching the film. The process may be implemented in inert atmosphere by enclosing the whole arrangement in a chamber and flowing inert gases such as Ar, He, and $N_2$, etc.

EMBODIMENTS OF THE INVENTION

Figure 1:
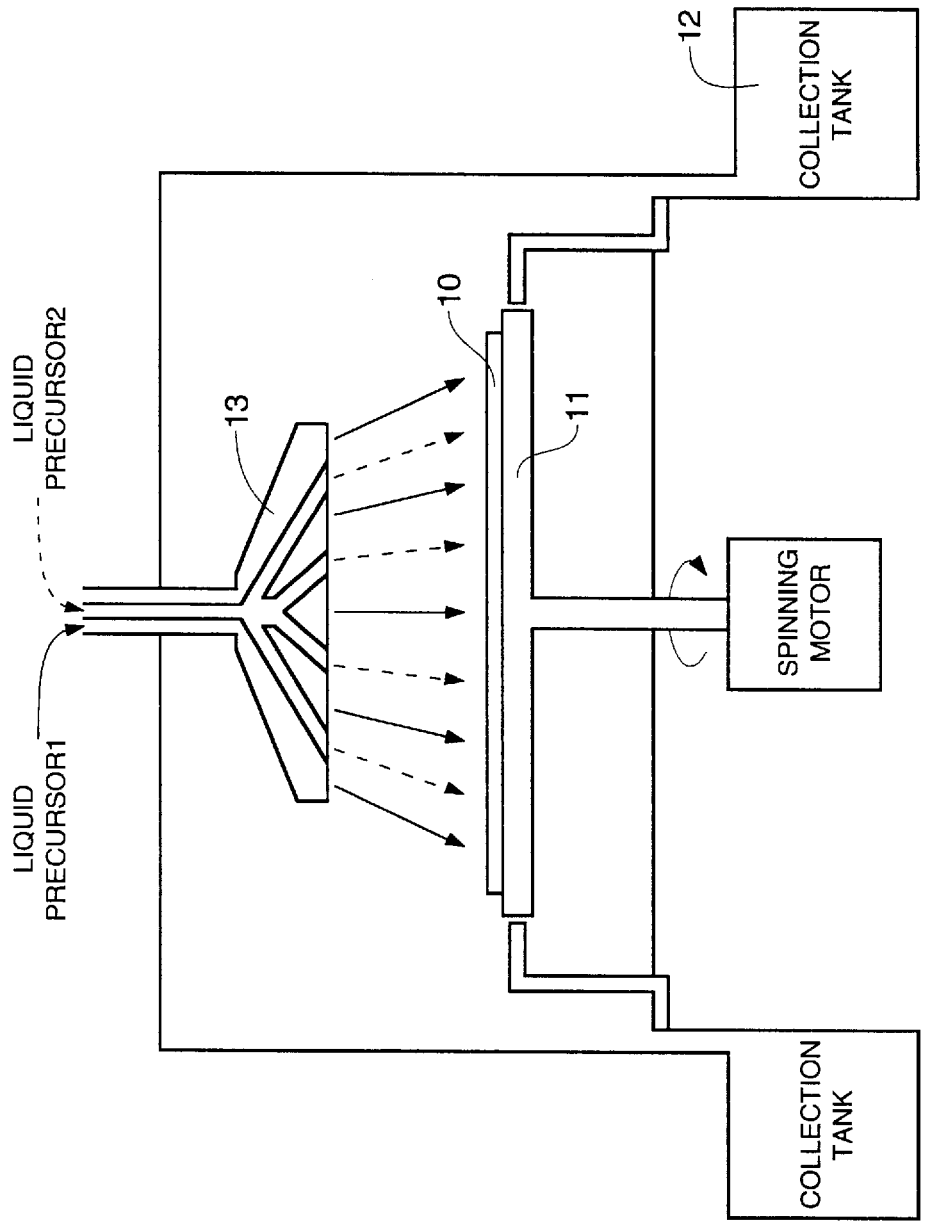
FIG. 1 depicts a deposition/etching system utilizing the present invention.

Several embodiments of the present invention are depicted in FIG. 1. The methods described hereinafter are applicable to both a bathless, electroless deposition process and a bathless, electroless etching process. For the bathless, electroless process the substrate surface is considered reactive as the surface is part of the reaction. For the bathless, electroless deposition process the substrate surface need not be reactive as the film may be deposited on the surface without having to react with the substrate's surface. As one skilled in the art will come to appreciate from the following discussion, the bathless, electroless deposition process may be performed on either a reactive or non-reactive substrate surface. However the methods will only be described in view of a bathless, electroless deposition process for clarity sake.

In a first embodiment and referring now to FIG. 1, a reactive or non-reactive silicon wafer 10 is mounted on a rotatable platform 11. A collection tank 12 is mounted such that excess liquid chemical precursors are recovered during the bathless, electroless deposition process. To perform the bathless, electroless deposition, chemically incompatible liquid precursors, such as copper EDTA and formaldehyde, are dispensed onto a reactive or non-reactive silicon wafer 10 via nozzle 13 while the wafer is spinning on rotating platform 11.

Once the chemically incompatible liquid precursors combine with each other after they pass through nozzle 13, they begin to chemically react with one another and form a uniform film on the surface of wafer 10. The film deposited will depend on the liquid precursors selected for use. The spinning wafer contributes to the uniformity of the film that is deposited.

Figure 2:
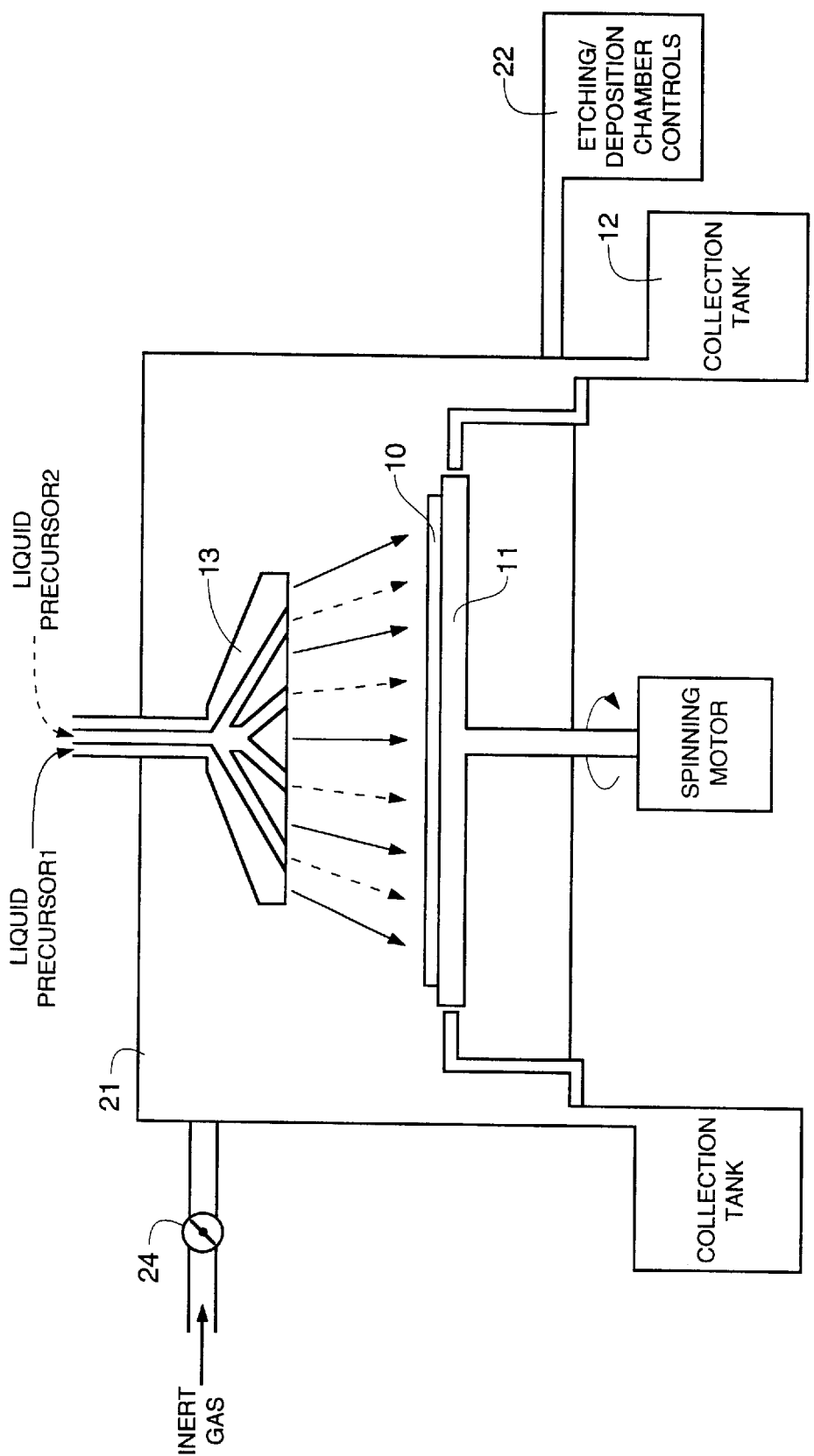
FIG. 2 depicts a deposition/etching system utilizing the present invention in an enclosed chamber.

In a second embodiment and referring now to FIG. 2, the apparatus used to perform the bathless electroless deposition process of FIG. 1 has been enclosed by deposition chamber 21 to provide an inert atmosphere and thus allowing the use of inert carrier gases or a purge gas, such as Ar, He, and $N_2$, etc. A reactive or non-reactive silicon wafer 10 is mounted on a rotatable platform 11. A collection tank 12 is mounted such that excess liquid chemical precursors are recovered during the bathless, electroless deposition process. Conventional chemical vapor deposition controls 22, known to those skilled in the art, complete the bathless, deposition system.

To perform the bathless, electroless deposition, a selected liquid chemical precursor (or multiple liquid precursors) are introduced to nozzle 13 and a selected inert gas (such as Ar, He, and $N_2$ or any combination thereof) enters through valve 24. The liquid precursor(s) and the inert gas are then dispensed onto silicon wafer 10 while the wafer is spinning on rotating platform 11. The liquid precursor(s) are reactive to one another and thus must be dispensed separately into the chamber so that they only react inside the chamber and on the non-reactive substrate surface.

Any one of the embodiments of the present invention may be utilized to deposit or etch films by using those liquid precursors normally used in a liquid bath for depositing electroless nickel, and electroless palladium, respectively.

Also, in any one of the embodiments where the present invention is used to deposit films, it may be desirable to pre-clean the wafer surface, prior to electroless deposition, from any nucleation inhibitors (such as oxides and contaminants) by flowing a substance, such as hydrofluoric acid, over the substrate surface while the substrate is being spun.

Although the present invention is described in various embodiments, it will be apparent to one skilled in the art that changes and modifications may be made thereto without departing from the spirit and scope of the invention as claimed.

We claim:

1. An electroless deposition process for forming films on a non-reactive substrate surface in a bathless deposition apparatus, said process comprising the steps of:
   in a controlled environment, applying a liquid chemical precursor solution containing metal ions and a reducing agent solution to the surface of said substrate, said solutions are reactive to one another and enter the chamber of said deposition apparatus separately; and
   spinning said substrate during said application of said solutions.

2. The process of claim 1, wherein any unused solutions spun off of said substrate surface are collected and recycled for reuse.

3. The process of claim 1, wherein said liquid chemical precursor solution comprises a single liquid and said reducing agent solution comprises a single liquid.

4. The process of claim 3, wherein said liquid chemical precursor solution comprises copper Ethylenediaminetetraacetate (EDTA) and said reducing agent solution comprises formaldehyde.

5. The process of claim 1, wherein said solutions comprise multiple liquids.

6. The process of claim 1, wherein said film comprises metal films.

7. The process of claim 6, wherein said metal films comprise a metal selected from the group consisting of copper, nickel, gold, palladium and aluminum.

8. The process of claim 1, wherein said deposition apparatus comprises an enclosed chamber.

9. An electroless deposition process for forming films on a non-reactive substrate surface in a bathless inert atmosphere deposition apparatus, said process comprising the steps of:
   applying a liquid chemical precursor solution containing metal ions and an inert gas to the surface of said substrate, said liquid chemical precursor solution and said inert gas enter the chamber of said inert atmosphere deposition apparatus separately; and
   spinning said substrate during said application of said liquid chemical precursor solution and said inert gas.

10. The process of claim 9, wherein any unused liquid precursor solution is collected and recycled for reuse.

11. The process of claim 9, wherein said liquid chemical precursor solution comprises a single liquid.

12. The process of claim 9, wherein said liquid chemical precursor solution comprises multiple liquids.

13. The process of claim 9, wherein said film comprises metal films.

14. The process of claim 13, wherein said metal films comprise a metal selected from the group consisting of copper, nickel, gold, palladium and aluminum.

15. The process of claim 9, wherein said inert atmosphere deposition apparatus comprises an enclosed chemical deposition chamber.

16. The process of claim 9, wherein said inert gas is a gas selected from the group consisting of Ar, He, $N_2$ and any combination thereof.

17. The process of claim 9, wherein bathless deposition apparatus is operated at sub atmospheric pressure.

18. An electroless deposition process for forming films on a substrate surface in a bathless deposition apparatus, said process comprising the steps of:
   in a controlled environment, applying a liquid chemical precursor solution containing metal ions and a reducing agent solution to the surface of said substrate, said solutions are reactive to one another and enter the chamber of said deposition apparatus separately; and
   spinning said substrate during said application of said solutions.

19. The process of claim 18, wherein any unused solutions spun off of said substrate surface are collected and recycled for reuse.

20. The process of claim 18, wherein said liquid chemical precursor solution comprises a single liquid and said reducing agent solution comprises a single liquid.

21. The process of claim 20, wherein said liquid chemical precursor solution comprises copper Ethylenediaminetetraacetate (EDTA) and said reducing agent solution comprises formaldehyde.

22. The process of claim 18, wherein said solutions comprise multiple liquids.

23. The process of claim 18, wherein said film comprises metal films.

24. The process of claim 23, wherein said metal films comprise a metal selected from the group consisting of copper, nickel, gold, palladium and aluminum.

25. The process of claim 18, wherein said deposition apparatus comprises an enclosed chamber.

* * * * *